United States Patent
Yao et al.

(10) Patent No.: US 10,691,074 B2
(45) Date of Patent: Jun. 23, 2020

(54) TIME-TO-DIGITAL CONVERTER CIRCUIT

(71) Applicant: TEXAS INSTRUMENTS INCORPORATED, Dallas, TX (US)

(72) Inventors: Henry Yao, Santa Clara, CA (US); Sinjeet Dhanvantray Parekh, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/403,774

(22) Filed: May 6, 2019

(65) Prior Publication Data

US 2019/0339651 A1    Nov. 7, 2019

Related U.S. Application Data

(63) Continuation of application No. 15/991,020, filed on May 29, 2018, now Pat. No. 10,496,041.

(60) Provisional application No. 62/666,822, filed on May 4, 2018.

(51) Int. Cl.
*G04F 10/00* (2006.01)
*H03L 7/197* (2006.01)

(52) U.S. Cl.
CPC .......... *G04F 10/005* (2013.01); *H03L 7/197* (2013.01)

(58) Field of Classification Search
CPC ......... G04F 10/005; G04F 10/00; H03L 7/197
USPC .......... 327/141–163; 375/373–376; 331/1 A, 331/1 R
See application file for complete search history.

(56) References Cited

U.S. PATENT DOCUMENTS

| | | | |
|---|---|---|---|
| 5,200,933 A | 4/1993 | Thornton et al. | |
| 5,304,954 A | 4/1994 | Saito et al. | |
| 5,389,898 A | 2/1995 | Taketoshi et al. | |
| 5,796,682 A * | 8/1998 | Swapp | G04F 10/00 368/117 |
| 5,959,502 A | 9/1999 | Ovens et al. | |
| 6,308,055 B1 | 10/2001 | Welland et al. | |
| 6,310,653 B1 | 10/2001 | Malcolm, Jr. et al. | |
| 6,584,574 B1 | 6/2003 | Embree | |

(Continued)

FOREIGN PATENT DOCUMENTS

| | | |
|---|---|---|
| EP | 0644657 | 3/1995 |
| EP | 3182592 | 6/2017 |

(Continued)

OTHER PUBLICATIONS

Michael H. Perrott, "Tutorial on Digital Phase-Locked Loops;" CICC 2009. Sep. 2009 (118 pgs).

(Continued)

*Primary Examiner* — Tomi Skibinski
(74) *Attorney, Agent, or Firm* — Ray A. King; Charles A. Brill; Frank D. Cimino

(57) ABSTRACT

A time-to-digital converter circuit includes a logic gate coupled to receive a first trigger signal indicative of a first clock signal and a second trigger signal indicative of a second clock signal. The logic gate is to generate a logic gate output signal responsive to the earlier of the first or second trigger signals to be a logic high. A synchronization circuit is included and is coupled to the logic gate and is configured to synchronize the logic gate output signal to a third clock to produce a synchronization output signal. A counter circuit counts pulses of the synchronization output signal.

4 Claims, 2 Drawing Sheets

(56) References Cited

U.S. PATENT DOCUMENTS

| | | |
|---|---|---|
| 6,597,249 B2 | 7/2003 | Chien et al. |
| 7,126,429 B2 | 10/2006 | Mitric |
| 7,755,439 B2 | 7/2010 | Yu et al. |
| 7,876,136 B2 | 1/2011 | Ha et al. |
| 8,179,174 B2 | 5/2012 | Bunch |
| 8,368,438 B2 | 2/2013 | Furuta |
| 8,957,711 B2 | 2/2015 | Jin et al. |
| 9,020,089 B2 | 4/2015 | Da Dalt |
| 9,490,820 B2 | 11/2016 | Shiozaki |
| 9,634,826 B1 | 4/2017 | Park et al. |
| 9,859,901 B1 | 1/2018 | Chu et al. |
| 10,075,173 B2 | 9/2018 | Sarda |
| 10,128,858 B2 | 11/2018 | Goldberg et al. |
| 10,135,452 B2 | 11/2018 | Cherniak et al. |
| 10,141,941 B2 | 11/2018 | Petrov |
| 10,185,349 B2 | 1/2019 | Musunuri et al. |
| 10,193,561 B2 | 1/2019 | Lesso |
| 10,200,047 B2 | 2/2019 | Markulic et al. |
| 10,291,214 B2 | 5/2019 | Thijssen et al. |
| 2007/0085570 A1* | 4/2007 | Matsuta ............... H03D 13/004 327/3 |
| 2009/0015338 A1 | 1/2009 | Frey |
| 2009/0219073 A1 | 9/2009 | Sun et al. |
| 2009/0267664 A1 | 10/2009 | Uozumi et al. |
| 2011/0234270 A1 | 9/2011 | Kobayashi |
| 2011/0273210 A1 | 11/2011 | Nagaraj |
| 2012/0056769 A1 | 3/2012 | Wang et al. |
| 2012/0161834 A1 | 6/2012 | Lee et al. |
| 2013/0051290 A1 | 2/2013 | Endo et al. |
| 2014/0225653 A1 | 8/2014 | Nara et al. |
| 2014/0266351 A1 | 9/2014 | Na et al. |
| 2014/0266354 A1 | 9/2014 | Boo et al. |
| 2015/0077279 A1 | 3/2015 | Song et al. |
| 2015/0188553 A1 | 7/2015 | Familia et al. |
| 2015/0372690 A1 | 12/2015 | Tertinek et al. |
| 2016/0056827 A1 | 2/2016 | Vlachoginnakis et al. |
| 2016/0156362 A1 | 6/2016 | Kim et al. |
| 2016/0164532 A1 | 6/2016 | Zhang et al. |
| 2016/0204787 A1 | 7/2016 | Lotfy et al. |
| 2016/0238998 A1 | 8/2016 | Pavlovic et al. |
| 2016/0352506 A1 | 12/2016 | Huang |
| 2016/0380759 A1 | 12/2016 | Kondo et al. |
| 2017/0187383 A1 | 6/2017 | Lesso |
| 2017/0288686 A1 | 7/2017 | Burg et al. |
| 2018/0269885 A1 | 9/2018 | Kondo et al. |
| 2018/0351558 A1 | 12/2018 | Kuo et al. |

FOREIGN PATENT DOCUMENTS

| | | |
|---|---|---|
| JP | H11143570 | 5/1999 |
| JP | 2009260866 | 11/2009 |
| RU | 2154895 | 8/2000 |
| WO | 2008089460 | 7/2008 |
| WO | 2015161890 | 10/2015 |

OTHER PUBLICATIONS

Texas Instruments Data Sheet LMK05028 Low-Jitter Dual-Channel Network Synchronizer Clock with EEPROM, Feb. 2018 (94 pages).

International Search Report in corresponding PCT Application No. PCT/US2019/030892 dated Aug. 1, 2019 (3 pages).

International Search Report in corresponding PCT Application No. PCT/US2019/021968 dated Jun. 13, 2019 (2 pages).

International Search Report in corresponding PCT Application No. PCT/US2019/021966 dated Jun. 20, 2019 (2 pages).

International Search Report in corresponding PCT Application No. PCT/US2019/021599 dated May 30, 2019 (2 pages).

International Search Report in corresponding PCT Application No. PCT/US2019/021605 dated Oct. 31, 2019 (2 pages).

\* cited by examiner

TIME-TO-DIGITAL CONVERTER CIRCUIT

CROSS-REFERENCE TO RELATED APPLICATIONS

This continuation application claims priority to U.S. patent application Ser. No. 15/991,020, filed May 29, 2018, which claims the benefit of and priority to U.S. Provisional Application No. 62/666,822, filed May 4, 2018, both of which are hereby incorporated herein by reference in their entirety.

BACKGROUND

A time-to-digital converter (TDC) generates a digital output signal that encodes a time measurement. TDCs are used in a variety of applications. Some applications can use low resolution TDCs, while other applications benefit from higher resolution TDCs. A cellular base station, for example, benefits from a low flicker noise TDC in order to achieve a target phase noise of less than −105 dBc/Hz normalized to 122.88 MHz at 100 Hz offset with a bandwidth of 200 Hz.

SUMMARY

A time-to-digital converter circuit includes a logic gate coupled to receive a first trigger signal indicative of a first clock signal and a second trigger signal indicative of a second clock signal. The logic gate is to generate a logic gate output signal responsive to the earlier of the first or second trigger signals to be a logic high. A synchronization circuit is included and is coupled to the logic gate and is configured to synchronize the logic gate output signal to a third clock to produce a synchronization output signal. A counter circuit counts pulses of the synchronization output signal.

BRIEF DESCRIPTION OF THE DRAWINGS

For a detailed description of various examples, reference will now be made to the accompanying drawings in which.

DETAILED DESCRIPTION

The disclosed examples are directed to a counter-based time-to-digital converter (TDC) circuit that determines the time difference between corresponding edge of a reference clock and a second clock. The disclosed TDC circuit includes a digital counter and a relatively low flicker noise clock source. The TDC circuit generates start and stop signals for a ripple counter. The start signal is generated by the actively asserted edge of the earlier of the reference clock or the second clock, and a "high speed" clock is used to operate the counter. The reference to "high speed" in this disclosure does not impart any particular frequency to the high speed clock. The disclosed TDC is limited only by the flicker noise of the flip-flops used in the circuit thereby resulting in equivalent noise being less than the actual quantizing step of the TDC circuit.

Figure 1:
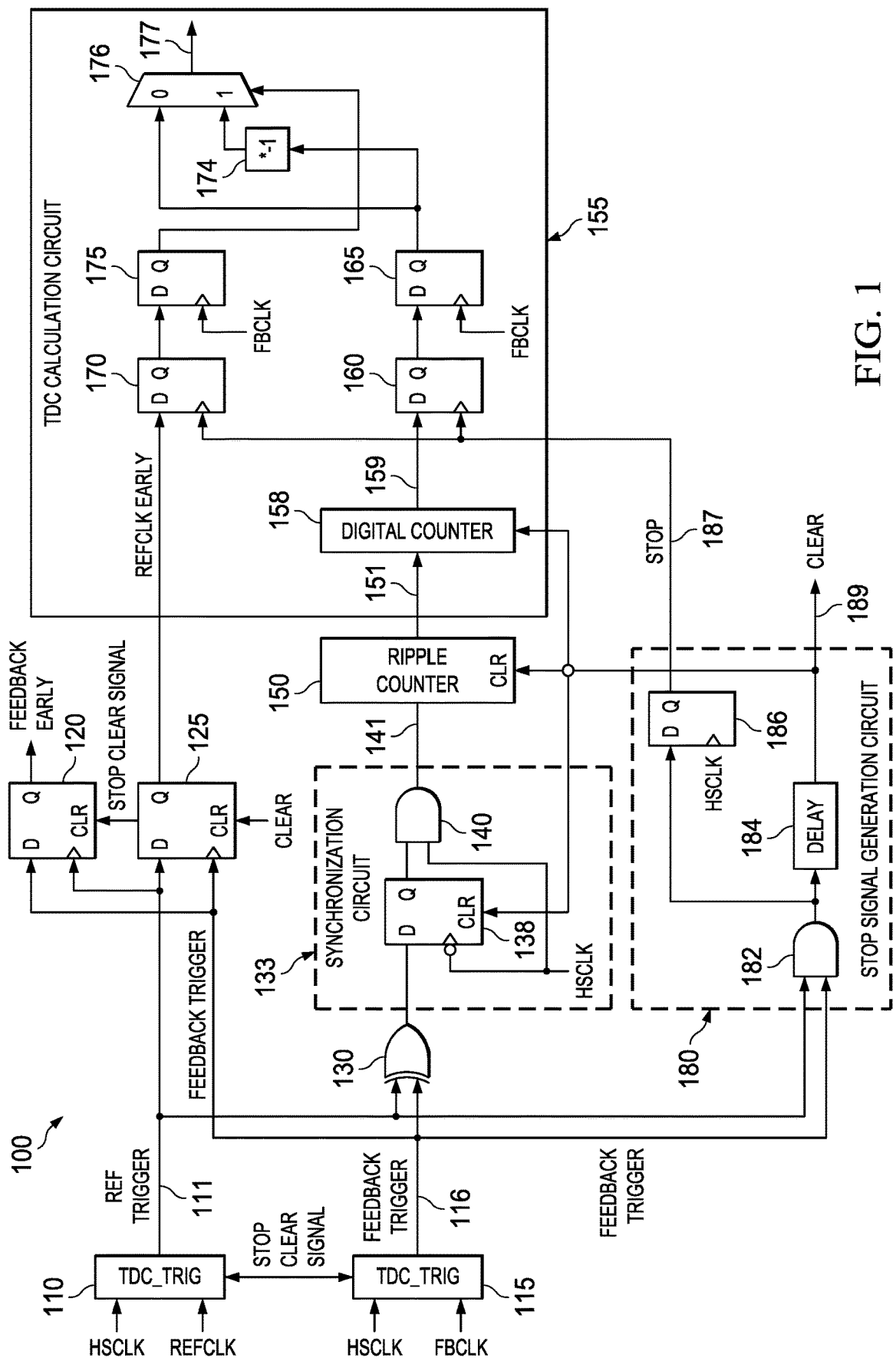
FIG. 1 illustrates a TDC in accordance with an example.
Figure 2:
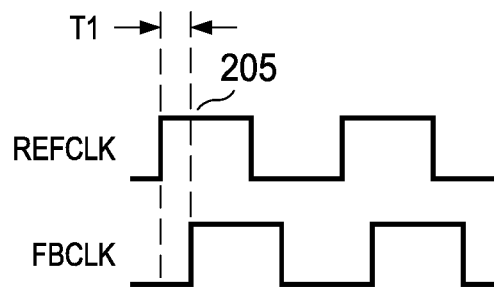
FIG. 2 is a timing diagram in which a reference clock edge precedes a feedback clock edge, the time difference of which is determined by the TDC of FIG. 1 in accordance with an example.
Figure 3:
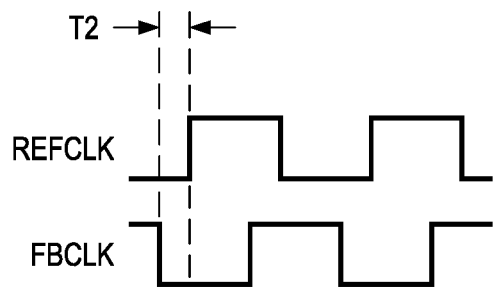
FIG. 3 is a timing diagram in which the feedback clock edge precedes the reference clock edge, the time difference of which is determined by the TDC of FIG. 1 in accordance with an example.

FIG. 1 shows an example of a TDC circuit 100. The disclosed TDC circuit 100 includes TDC trigger circuits (TDC_TRIG) 110 and 115, flip-flops 120 and 125, logic gate 130, synchronization circuit 133, ripple counter 150, TDC calculation circuit 155, and stop signal generation circuit 180. The TDC circuit 100 determines the time difference between corresponding edges of a reference clock (REFCLK) and a feedback clock (FBCLK). Referring briefly to FIG. 2, a timing diagram example is shown in which a rising edge of REFCLK occurs before a rising edge of the FBCLK, and the TDC circuit 100 determines the time difference T1 as shown. FIG. 3 shows an example of a timing diagram in which a rising edge of FBCLK occurs before a rising edge of REFCLK, and the TDC circuit 100 determines the time difference T2 as shown.

Referring again to FIG. 1, REFCLK is provided to an input of TDC trigger circuit 110 and FBCLK is provided to an input of TDC trigger circuit 115. Another input of each of the TDC trigger circuits 110, 115 is a high speed clock (HSCLK), although as noted above, the term "high speed" should not be interpreted as imparting any particular frequency to HSCLK. Each trigger circuit 110, 115 synchronizes its input signal (REFCLK or FBCLK) to an edge of the HSCLK. The output signal 111 from the TDC trigger circuit 110 is designated as REF Trigger and transitions from low to high (or vice versa depending what is considered to be an active edge) when REFCLK is high when and HSCLK transitions from low to high. That is, REFCLK transitioning from low to high causes a corresponding transition in REF Trigger upon the next active edge of HSCLK. Similarly, the output signal 116 from the TDC trigger circuit 115 is designated as Feedback Trigger and transitions from low to high when FBCLK is high and when HSCLK transitions from low to high. That is, FBCLK transitioning from low to high causes a corresponding transition in Feedback Trigger upon the next active edge of HSCLK.

Logic gate 130 is shown in the example of FIG. 1 as being an exclusive-OR gate (and is referred to herein as exclusive-OR gate 130), but could be implemented as other logic gates or combinations of logic gates. The inputs of exclusive-OR gate 130 include the REF Trigger signal 111 and the Feedback Trigger signal 116. The output of the exclusive-OR gate 130 is provided to the synchronization circuit 133. The output of the exclusive-OR gate 130 is a logic high when one, but not both, of the REF Trigger and the Feedback Trigger signals 111 and 116 are logic high, that is, upon occurrence of the earliest rising edge of REFCLK or FBCLK.

The synchronization circuit 133 includes a D flip-flop 138 and an AND gate 140. The D flip-flop 138 includes a data input (D), a clock input and an output (Q). The output signal from the exclusive-OR gate 130 is provided to the D input of flip-flop 138. The HSCLK is provided to the clock input of the D flip-flop and the output Q is coupled to an input of AND gate 140. The other input of AND gate 140 also receives HSCLK. When the first of the active edge of REF Trigger 111 or Feedback Trigger 116 is received, the output of the exclusive-OR gate 130 becomes a logic high. Upon the next active edge of HSCLK, the logic high on the D input of flip-flop 138 is latched through to the output Q of the flip-flop, and, with HSCLK still being high causes the synchronization output signal 141 of the AND gate 140 to be high. The output of AND gate 140 represents the input to ripple counter 150.

In some examples, the ripple counter 150 is implemented as an asynchronous counter comprising multiple serially-connected flip-flops where an input flip-flop is clocked by an external clock, and each subsequent flip-flop is clocked by the output of the preceding flip-flop. The external clock that clocks the input flip-flop of ripple counter 150 is the synchronization output signal 141 from AND gate 140. The count output 151 of the ripple counter 150 is provided as an input to the TDC calculation circuit 155.

The TDC calculation circuit includes digital counter 158, flip-flops 160, 165, 170, 175, two's complement circuit 174, and a multiplexer 176. The digital counter 158 counts active edges of the output 151 from the ripple counter 150 and provides an output count value 159. The combination of ripple counter 150 and digital counter 158 represents a counter circuit.

Referring still to the example of FIG. 1, stop signal generation circuit 180 includes an AND gate 182, a delay element 184, and a D flip-flop 186. The inputs to AND gate 182 comprise the REF Trigger signal 111 and the Feedback Trigger signal 116 from the TDC trigger circuits 110 and 115, respectively. When both the REF Trigger signal 111 and the Feedback Trigger signal 116 are high (which occurs, for example, at point 205 in FIG. 2), the output of AND gate 182 becomes a logic high. Both the REF Trigger signal 111 and the Feedback Trigger signal 116 being high represents the stop condition when the counting process should cease. The output of the AND gate 182 is latched into D flip-flop 186 upon occurrence of the next active edge of HSCLK. The Q output of D flip-flop 186 represents the STOP signal 187 and is provided to the TDC calculation circuit 155 and used to clock flip-flops 160 and 170. Flip-flop 160 latches in the count value 159 from the digital counter 158 upon occurrence of an active edge of the STOP signal 187. The FBCLK signal is then used to latch the count output of flip-flop 160 by flip-flop 165 to thereby synchronize the count value to the FBCLK.

The delay element 184 delays the output of AND gate 182 to provide a CLEAR signal 189. The CLEAR signal 189 is essentially a delayed version of the STOP signal 187 with enough of a delay to ensure that the CLEAR signal 189 is asserted high at a time that that the count value from the digital counter 158 has been fully latched through flip-flops 160 and 170. The CLEAR signal 189 is provided to the clear inputs of the flip-flop 138, the ripple counter 150, the digital counter 158, and flip-flops 120 and 125. The CLEAR signal 189 resets these components in preparation for the generation of a new count value from the ripple and digital counters 150 and 158.

As noted with respect to FIGS. 2 and 3, the active edge of FBCLK may come before or after the corresponding active edge of REFCLK. The condition of FIG. 2 in which the active REFCLK occurs before the active edge of FBCLK represents a positive count value. The condition of FIG. 3 in which REFCLK's active edge occurs after that of FBCLK represents a negative count value. Thus, the count value from the digital counter 158 may need to be modified to, for example, convert it to a negative count value if the active edge of FBCLK precedes that of REFCLK. Flip-flops 120 and 125 are provided to determine whether the count value is to be converted to a negative value. Flip-flop 120 latches the Feedback Trigger signal 116 using REF Trigger 111 as a clock signal, and flip-flop 125 latches the REF Trigger signal 111 using Feedback Trigger 116 as a clock signal. The output of flip-flop 120 is designated as the Feedback Early signal and when asserted high indicates that the active edge of FBCLK occurred before the corresponding active edge of REFCLK. The output of flip-flop 125 is designated as the REFCLK Early signal and when asserted high indicates that the active edge of REFCLK occurred before the corresponding active edge of FBCLK. In some examples, the Feedback Early output signal from flip-flop 120 is not used and in some examples, flip-flop 120 is not present. In some examples, however, the REFCLK Early signal from flip-flop 125 is latched into flip-flop 170 of the TDC calculation circuit 155 using the STOP signal 187 and the output of flip-flop 170 is latched into flip-flop 175 using FBCLK to align the REFCLK Early signal to FBCLK.

The output of flip-flop 175 being asserted low indicates that REFCLK's active edge precedes that of FBCLK and the output of flip-flop 175 being asserted high indicates that FBCLK's active edge precedes that of REFCLK. The output of flip-flop 175 is used as a control signal to control the selection of the inputs to multiplexer 176. One input of multiplexer 176 (the "0" input) is the latched count value from flip-flop 165. The other input to the multiplexer 176 (the "1" input) is the two's complement of the count value from flip-flop 165. The bits of the count value from the flip-flop 165 is converted to a two's complement form by two's complement circuit 174. In one example, the two's complement circuit 174 inverts each of the bits of the output count value from flip-flop 165 and then add 1 to least significant bit of that result. The output 177 from the multiplexer 176 represents the count value (either positive or negative) that encodes the time difference between corresponding edges of REFCLK and FBCLK.

Figure 4:
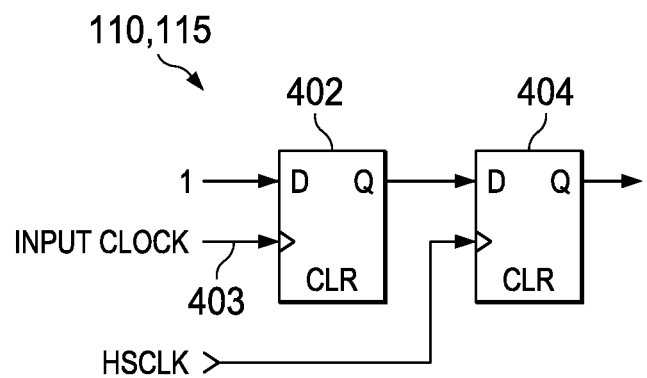
FIG. 4 shows an example of a trigger circuit usable in the TDC of FIG. 1.

FIG. 4 shows an example implementation of each of the TDC trigger circuits 110, 115. The TDC trigger circuit of FIG. 4 includes serially-connected flip-flops 402 and 404. The D input of flip-flop 402 is tied to a logic high (1) and the Q out of flip-flop 402 is coupled to the D input of flip-flop 404. The input clock 403 of flip-flop 402 is designated as "input clock" in FIG. 4, but would be the REFCLK in the case of TDC trigger circuit 110 or the FBCLK in the case of TDC trigger circuit 115. The HSCLK is used to clock flip-flop 404. The Q output of flip-flop 404 is the REF Trigger signal 111 (for the TDC trigger circuit 110) or the Feedback Trigger signal 116 (for the TDC trigger circuit 116). The Q output of flip-flop 404 will be a logic high when the input clock 403 experiences an active edge (e.g., a rising edge) or active high upon the next active edge (e.g., low to high) or active high of HSCLK.

Figure 5:
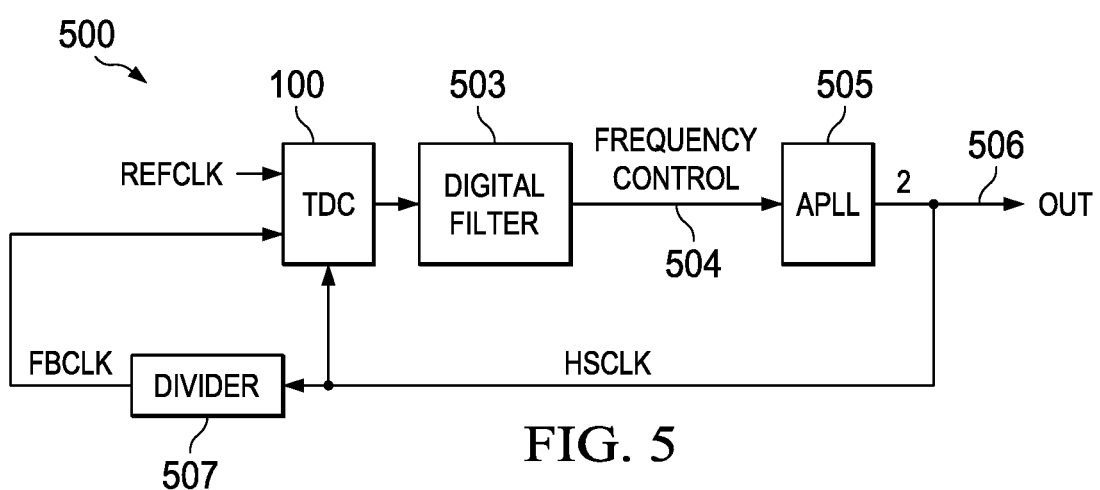
FIG. 5 shows an example phase-locked loop that includes the TDC of FIG. 1.

FIG. 5 provides an example of the use of the TDC circuit 100. The example of FIG. 5 includes TDC circuit 100, a digital filter 503, an analog phase-locked loop (APLL) 505, and a frequency divider 507. The output signal (OUT) 506 from the APLL is a periodic signal generated by the APLL 505 and phase-aligned to the REFCLK. The frequency of OUT 506 may be a higher frequency than REFCLK and thus a frequency divider 507 is included to divide down the frequency to match that of REFCLK. The output signal from the frequency divider 507 is FBCLK as shown. The TDC circuit 100 functions as described above to determine the time between corresponding edge of REFCLK and FBCLK from the divider 507. The digital filter 503 filters the TDC's output count value to generate a frequency control signal 504 to adjust the frequency and/or phase of OUT 506 by the APLL 505. The OUT 506 of the APLL 505 also is used as the HSCLK and is used by the TDC circuit 100 as described above. With this architecture, the effective time resolution of the TDC circuit 100 is not the period of HSCLK, rather the effective time resolution of the TDC circuit 100 is limited by the setup and hold time of flip-flop 404 (FIG. 4).

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A time-to-digital converter circuit, comprising:
   a first logic gate coupled to receive a first trigger signal indicative of a first clock signal and a second trigger signal indicative of a second clock signal, the first logic gate to generate a logic gate output signal responsive to the earliest of the first or second trigger signals to be a logic high;
   a synchronization circuit coupled to the first logic gate and configured to synchronize the logic gate output signal to a third clock to produce a synchronization output signal;
   a pulse counter circuit to count pulses of the synchronization output signal; and
   a circuit to stop the pulse counter counting pulses that includes a first logic gate, a delay element, and a flip-flop.

2. The time-to-digital converter circuit of claim 1, wherein the first logic gate includes an exclusive-OR gate.

3. The time-to-digital converter circuit of claim 1, further comprising:
   a first trigger circuit to receive the first clock and the third clock and to generate the first trigger signal, wherein the first trigger circuit is to assert the first trigger signal responsive to an asserted edge of the third clock coincident with the first clock asserted high; and
   a second trigger circuit to receive the second clock and the third clock and to generate the second trigger signal, wherein the second trigger circuit is to assert the second trigger signal responsive to an asserted edge of the third clock coincident with the second clock asserted high.

4. The time-to-digital converter circuit of claim 3, wherein:
   the first trigger circuit comprises a plurality of serially-connected flip-flops; and
   the second trigger circuit comprises a plurality of serially-connected flip-flops.

* * * * *